United States Patent
Suzuki

(10) Patent No.: US 8,118,984 B2
(45) Date of Patent: Feb. 21, 2012

(54) SINTERED SPUTTERING TARGET MADE OF REFRACTORY METALS

(75) Inventor: Ryo Suzuki, Ibaraki (JP)

(73) Assignee: JX Nippon Mining & Metals Corporation, Tokyo (JP)

( * ) Notice: Subject to any disclaimer, the term of this patent is extended or adjusted under 35 U.S.C. 154(b) by 607 days.

(21) Appl. No.: 12/279,067

(22) PCT Filed: Feb. 22, 2007

(86) PCT No.: PCT/JP2007/053284
§ 371 (c)(1),
(2), (4) Date: Aug. 12, 2008

(87) PCT Pub. No.: WO2007/097396
PCT Pub. Date: Aug. 30, 2007

(65) Prior Publication Data
US 2009/0173627 A1    Jul. 9, 2009

(30) Foreign Application Priority Data
Feb. 22, 2006    (JP) .................................. 2006-045204

(51) Int. Cl.
C23C 14/00    (2006.01)
C25B 11/00    (2006.01)
C25B 13/00    (2006.01)

(52) U.S. Cl. ............................. 204/298.12; 204/298.13

(58) Field of Classification Search ............. 204/298.12, 204/298.13
See application file for complete search history.

(56) References Cited

U.S. PATENT DOCUMENTS

| 6,036,741 | A | 3/2000 | Shindo et al. |
| 6,284,013 | B1 | 9/2001 | Shindo et al. |
| 6,589,311 | B1 * | 7/2003 | Han et al. .......................... 75/245 |
| 6,843,975 | B1 | 1/2005 | Suzuki |
| 7,252,794 | B2 | 8/2007 | Suzuki |
| 2003/0052000 | A1 * | 3/2003 | Segal et al. .............. 204/298.13 |
| 2004/0144204 | A1 | 7/2004 | Hisano |
| 2006/0185771 | A1 | 8/2006 | Inoue et al. |
| 2007/0175753 | A1 | 8/2007 | Hisano |
| 2007/0240992 | A1 | 10/2007 | Shindo et al. |

FOREIGN PATENT DOCUMENTS

| JP | 2000-345327 A | 12/2000 |
| JP | 2000345327 A | * 12/2000 |
| JP | 2002-167668 A | 6/2002 |
| JP | 2002-275625 A | 9/2002 |
| JP | 2005-336583 A | 12/2005 |

OTHER PUBLICATIONS esp@cenet database, One Page English Abstract of JP 11-036067 A, Feb. 9, 1999.

(Continued)

Primary Examiner — Luan Van
Assistant Examiner — Ibrahime A Abraham
(74) Attorney, Agent, or Firm — Howson & Howson LLP

(57) ABSTRACT

Proposed is a sintered sputtering target containing two or more types of refractory metals. In particular, proposed is a sintered sputtering target of refractory metals that is able to improve the target structure to prevent the dropout of metal particles other than the matrix-forming major component, improve the deposition quality as well as the workability of the target by reducing impurities such as gas components, enhancing the density and eliminating the generation of arcing and particles in sputtering. This sintered sputtering target of refractory metals is composed of one or more types of minor components selected from W, Ta and Hf at less than 50 at % as well as at least one or more major components selected from Ru, Rh and Ir and inevitable impurities as the remainder. The metal structure of the major component comprises a granular minor component metal phase, or an alloy phase or a compound phase of the major and the minor component having an average grain size of 100 μm to 500 μm.

18 Claims, 1 Drawing Sheet

OTHER PUBLICATIONS esp@cenet database, One Page English Abstract of JP 05-156384 A, Jun. 22, 1993.

esp@cenet database, One Page English Abstract of JP 2000-355761 A, Dec. 26, 2000.

* cited by examiner

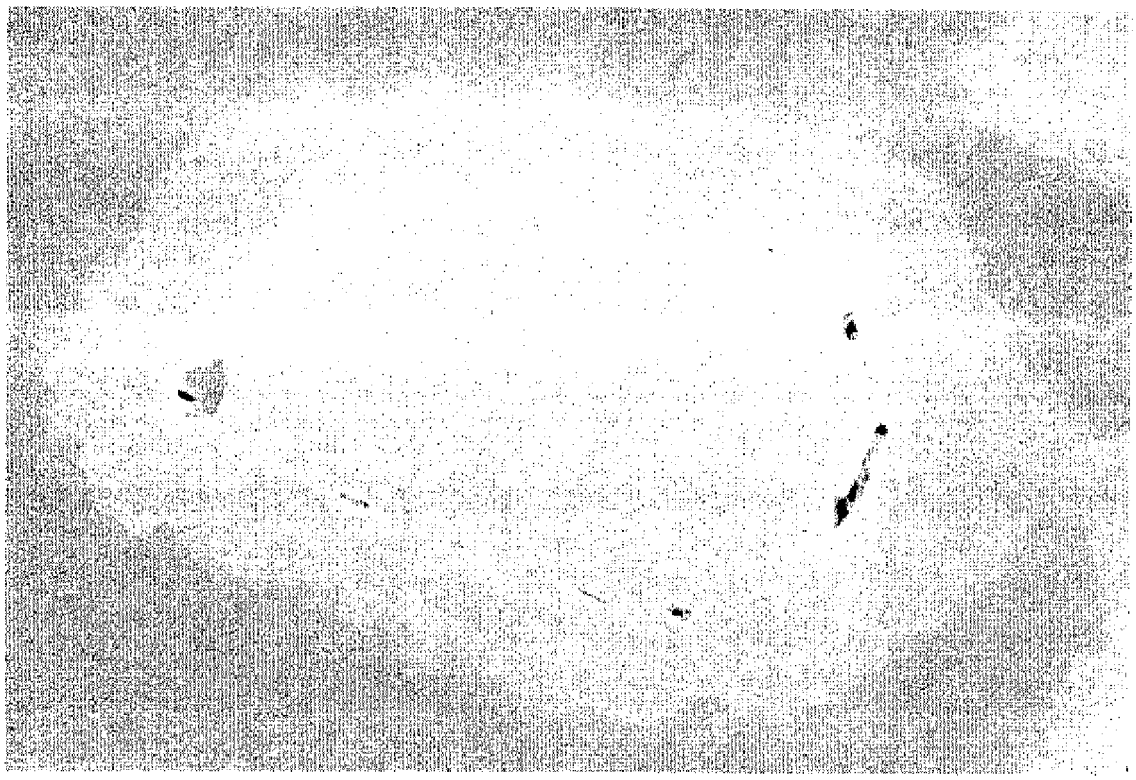

SINTERED SPUTTERING TARGET MADE OF REFRACTORY METALS

BACKGROUND OF THE INVENTION

The present invention relates to a sintered sputtering target containing two or more types of refractory metals which is capable of improving the target structure to prevent the dropout of metal particles other than the matrix-forming major component, and improving the deposition quality by eliminating the generation of arcing and particles in sputtering.

Since ruthenium (Ru), rhodium (Rh) and iridium (Ir) as refractory metals have superior thermal stability, and also possess superior low resistivity and barrier properties, they are attracting attention as a deposition material of semiconductor devices, and particularly as a gate electrode material and various diffusion barrier materials.

Although ruthenium (Ru), rhodium (Rh) and iridium (Ir) are sometimes used independently as a thin film or as a target material for forming such a thin film, there is a problem in that the wettability during the plating process is inferior.

Thus, in order to overcome this drawback, proposals have been made to add other metals (in particular refractory metals) to the three metals of ruthenium (Ru), rhodium (Rh) and iridium (Ir).

The well known sputtering method is generally used as the means for forming a thin film. A radio frequency (RF) sputtering device is used as the sputtering method. The manufacture of an alloy target of the foregoing composition is essential when performing sputtering. In addition, improving the target quality is extremely important in order to improve the deposition quality.

Although the method of melting and plastic working can be considered when manufacturing a target by adding a refractory metal to ruthenium (Ru), rhodium (Rh) or iridium (Ir) as the refractory metal, since ruthenium, rhodium, and iridium have high melting points and are fragile materials, the melter is extremely expensive and plastic working also requires special skills. Thus, there is a problem in that the manufacturing cost becomes high.

In view of the above, it is suitable to use the sintering method for manufacturing a target. Nevertheless, even when manufacturing a sintered compact from two or more types of refractory metals, it is not necessarily easy to improve the quality of the target.

If the content of alloy elements as the minor component in ruthenium (Ru), rhodium (Rh) or iridium (Ir) as the refractory metal is low, then this will not become a significant problem. Nevertheless, if the additive amount of alloy to become the minor component is increased, metals as the minor component will exist in dots (island shape) in the structure (matrix component) as the major component, and these will drop out in sputtering and generate particles.

Since holes are formed after the dropout and irregular edges are formed in the vicinity of such holes, these will cause the generation of abnormal discharge in sputtering, and cause a problem of generating even more particles. In order to improve the quality of deposition, there are strong demands for eliminating the generation of such particles.

Gas components or other impurities existing in the target are also easily collected at the interface of the structure, and the existence of these impurities also causes the generation of arcing and particles in sputtering. Thus, there is a problem in that the sintering density will deteriorate and weaken the target strength and lower the deposition quality.

Although the following explanation does not directly relate to the target of the present invention, proposals concerning measures for preventing the generation of particles and cracks in the target (improvement of bending strength) that have been made in connection with refractory metal targets are now explained for reference.

A molybdenum-tungsten target having a bending strength of 750 Mpa composed primarily of molybdenum and tungsten, wherein the structure is achieved by sintering molybdenum particles and tungsten particles with a diffusion bonding distance of 1.0 μm or less (refer to Patent Document 1).

A manufacturing method of a tungsten-titanium target material for preventing the generation of particles and which is used for obtaining a sintered compact having an average grain size of 50 μm or less, wherein mixed powder of tungsten powder and titanium powder is subject to pressure sintering at 1500 to 1700° C., and comprising a structure composed of a titanium-tungsten alloy phase, a tungsten phase, and a titanium phase having an area ratio of 20% or greater in the target cross section (refer to Patent Document 2).

A Ta target for forming a barrier film capable of preventing the generation of particles obtained by sintering one or two or more types of powder (C, B, Ir, W, Ge, CeO2, RuO2) of 49 at % or less and Ta powder of 51 at % or more (refer to Patent Document 3).

[Patent Document 1] Japanese Patent Laid-Open Publication No.H11-36067

[Patent Document 2] Japanese Patent Laid-Open Publication No.H5-156384

[Patent Document 3] Japanese Patent Laid-Open Publication No.2000-355761

SUMMARY OF THE INVENTION

The present invention was devised in view of the foregoing points, and proposes a sintered sputtering target of refractory metals that is able to improve the target structure for preventing the dropout of metal particles other than the matrix-forming major component, improve the deposition quality as well as the workability of the target by reducing impurities such as gas components, enhancing the density and eliminating the generation of arcing and particles in sputtering.

In order to achieve the foregoing object, the present inventors discovered that an alloy target for sputtering with ruthenium, rhodium, or iridium as its major component and having superior deposition characteristics in comparison to conventional art can be obtained by adding an minor component of refractory metals at less than 50 at % selected from one or more types among W, Ta and Hf to a major component of at least one or more types selected from Ru, Rh and Ir, preventing the dropout of particles, reducing the impurity content of gas components and the like, and additionally enhancing the density by improving and devising the target structure.

Based on the foregoing discovery, the present invention provides a sintered sputtering target of refractory metals composed of one or more types of minor components selected from W, Ta and Hf at less than 50 at % and at least one or more major components as the remainder selected from Ru, Rh and Ir, wherein the metal structure of the major component comprises a granular minor component metal phase, or an alloy phase or a compound phase of the major and the minor component having an average grain size of 100 μm to 500 μm.

The sintered sputtering target composed of refractory metals of the present invention is composed of at least one or more major components selected from Ru, Rh and Ir. These refractory metals may be independent or compound materials, but the total amount thereof shall be 50 at % or greater as the major component.

Since these refractory metals have superior thermal stability, and also possess superior low resistivity and barrier properties, they are useful as a deposition material of semiconductor devices, and particularly as a gate electrode material and various diffusion barrier materials. Desirably, the metal structure composed of Ru, Rh or Ir as the matrix comprises a roughly uniform average grain size of 10 to 30 μm. Although this is not an "essential" constituent feature of the present invention, this is effective in reducing the generation or arcing and particles in sputtering, and is a preferable mode since the uniformity of the sputtered film structure can be improved.

W, Ta or Hf as the minor component is added in the amount of 5 at % or more and less than 50 at %. Here, this may be an independent addition or an addition of two or more types of minor components. The additive amount may be arbitrarily selected according to the purpose of use. These minor components are effective in improving the plating wettability of a thin film composed of refractory metals with Ru, Rh or Ir as the major component. The reason why the amount of minor components is made to be 5 at % or more is because the additive effect cannot be yielded if it is less than that amount. Meanwhile, the maximum additive amount of minor components is less than 50 at % from the restriction as an minor component.

The issue is the existence form of these minor components in the target. The metal phase (including an alloy phase or compound phase) as these minor components exists as grains in the metal structure as the matrix. The term "grains" as used herein means the independent, combined or composite shape in the form of flakes, globular substances, corded substances or other shapes, and it should be understood that there is no particular limitation regarding this shape.

These grains as the minor component are composed of a granular minor component metal phase, or an alloy phase or a compound phase of a major component and an minor component having an average grain size of 100 μm to 500 μm. These grains are scattered in the form of particles in the metal structure composed of major components. The term "scattered" as used herein refers to a state where the grains exist almost independently and scattered over the matrix.

This existence form is extremely important. If numerous minor component particles that are less than 100 μm exist in the metal structure, there is a problem in that such fine particles will flake in sputtering. In other words, the smaller the minor component particles existing in the matrix, the bonding with the matrix will be shallow and weak, and it becomes more likely that the particles will fall off (drop out) from the peripheral metal structure. Contrarily, if the grain size is large, it is less likely for this to happen.

Meanwhile, if the number of grains that exceed 500 μm increases, segregation of the minor component in relation to the major component will become noticeable, and it is desirable that the grain size is 500 μm or less in order to achieve uniform deposition. In particular, it is desirable to comprise a granular minor component metal phase, or an alloy phase or a compound phase of the major and minor component of average granular size of 100 μm to 300 μm.

These refractory metals as the minor component are exposed to heat during sintering and more or less form an alloy phase or a compound phase with the peripheral refractory metals as the major component. In this case, the alloy phase or compound phase functions to strengthen the bonding of the particles as the minor component with the refractory metals of the peripheral matrix. Therefore, the existence of such alloy phase or compound phase is useful in preventing the flaking of minor component particles.

In particular, desirably, the periphery of the granular minor component metal phase comprises an alloy phase or a compound phase of the major and the minor component having an average width of 5 μm to 50 μm. More preferably, the periphery of the granular minor component metal phase comprises an alloy phase or a compound phase of the major and the minor component having an average width of 5 μm to 100 μm, and most preferably, the periphery of the granular minor component metal phase comprises an alloy phase or a compound phase of the major and the minor component having an average width of 5 μm to 200 μm.

Meanwhile, since the alloy phase or compound phase is hard to begin with, if there is a large quantity thereof the workability sometimes deteriorates, and, although this also depends on the combination of the refractory metals, it is desirable that the upper limit is 200 μm or less.

The present invention also provides a sintered sputtering target composed of the foregoing refractory metals wherein, as gas component impurities, the oxygen content is 300 wtppm or less and the carbon content is 100 wtppm or less. The present invention additionally provides a sintered sputtering target composed of the foregoing refractory metals wherein the total amount of impurity content excluding gas components is 100 wtppm or less.

Although this is not an "essential" constituent feature of the present invention, this is effective in reducing the generation of arcing or particles in sputtering, and is a preferable mode since the uniformity of the sputtered film structure can be improved. Thus, it is a preferable mode to simultaneously reduce gas components and other impurities.

With the sintered sputtering target composed of refractory metals according to the present invention, desirably the relative density is 98% or higher, and voids of 100 μm or greater do not exist.

The existence of voids is directly related to the density, and, with the sintered sputtering target composed of refractory metals, it is possible to prevent the generation of cracks in the target and reduce the generation of particles by enhancing the density. This is also a preferred mode, although it is not a primary (essential) constituent feature of the present invention.

With the sintered sputtering target composed of refractory metals according the present invention, desirably the variation in the alloy composition per 1 $cm^2$ of the target area is ±10% or less. It is difficult to obtain a target material in a completely solid solution state since the present invention is a sintered compact composed of two or more types of refractory metals. Nevertheless, in order to secure the uniformity of the target as much as possible, it is desirable to keep the variation in the alloy composition to be ±10% or less. This is also a preferred mode, although it is not a primary (essential) constituent feature of the present invention.

As the result of the above, the sintered sputtering target composed of refractory metals according to the present invention yields a superior effect of being able to improve the target structure for preventing the dropout of metal particles other than the matrix-forming major component, improve the deposition quality as well as the workability of the target by reducing impurities such as gas components, enhancing the density and eliminating the generation of arcing and particles in sputtering.

DESCRIPTION OF DRAWINGS

FIG. 1 is a diagram showing the structure of the refractory metal target of Example 1-2.

DETAILED DESCRIPTION OF THE INVENTION

The high melting point alloy sputtering target composed of ruthenium (Ru) alloy, rhodium (Rh) alloy, or iridium (Ir) alloy is obtained by mixing one or more types of ruthenium powder, rhodium powder and iridium powder with metal powder composed from one or more types of minor components among tungsten (W), tantalum (Ta) and hafnium (Hf) in a total amount of less than 50 at %, and sintering this mixed powder.

The film obtained by sputtering this target is useful as a deposition material of a semiconductor device, particularly as a gate electrode material and various diffusion barrier materials. The present invention, however, is not limited to these uses, and it should be obviously understood that this invention can be applied to materials of other uses, and are covered by this invention.

Generally speaking, the grain size of the sintered powder is reflected on the structure after sintering, and it is necessary to control the grain size at the stage of the raw material powder. If the powder is refined excessively, the powder will absorb oxygen and it will become difficult to realize a low oxygen content. Thus, from this perspective also, it is desirable to avoid using excessively fine powder.

The size of the raw material powder will affect the refinement of the minor component phase; that is, the existence of large amounts of fine particles in the target will cause the generation of particles, and it is therefore necessary to control the size of the sintered raw material that will affect the structure of the sintered target to be of a certain level.

As a specific manufacturing method of the sintered compact target composed of refractory metals according to the present invention, for instance, commercially available 4N grade (purity of 99.99%) ruthenium powder, rhodium powder or iridium powder (each a low oxygen product) is introduced into an ultrahigh vacuum chamber, and the ruthenium powder is heated via high output infrared lamp heating or microwave heating in order to eliminate oxygen. The powder temperature is approximately 1100 to 1300° C. This is because if the temperature is not 1100° C. or higher, oxygen cannot be separated sufficiently.

This heating is performed so that the ruthenium powder, rhodium powder or iridium powder will not bond with each other and deteriorate the sinterability, and the reason lamp heating or microwave heating is performed is so that the powder can be cooled to room temperature quickly. After the sufficient discharge of oxygen has been confirmed with the oxygen monitor connected to the chamber, the heating is stopped and quenching is commenced.

Subsequently, argon gas is introduced and the foregoing ruthenium powder, rhodium powder or iridium powder is sealed in a container, and then 4N grade (purity of 99.99 wt %) tungsten powder, tantalum powder or hafnium powder is mixed thereto.

Each of the tungsten powder, tantalum powder or hafnium powder is obtained by pulverizing the EB ingot of each metal through repeated hydrogenation and dehydrogenation.

This mixed powder is subject to deoxidation treatment at 1100° C. once again, hot pressed in a vacuum at a temperature of 1300 to 1800° C., and then subject to hot isostatic press treatment in order to create a sintered compact. This is further subject to finishing (machining or the like) to obtain the intended target shape.

The obtained ruthenium alloy, rhodium alloy or iridium alloy-sintered sputtering target has a purity of 99.99 wt % or higher excluding gas components.

A granular minor component metal phase, or an alloy phase or a compound phase of the major and the minor component having an average grain size of 100 μm to 500 μm can be scattered in the metal structure composed of major components by selecting the grain size of the powder and adjusting and selecting the sintering conditions (temperature and welding pressure). In addition, the elimination of gas components can be achieved by adopting a method of eliminating gas components under conditions where oxygen and carbon will not get mixed in.

EXAMPLES

The present invention is now explained in detail with reference to the Examples. These Examples are merely illustrative, and the present invention shall not be limited thereby. In other words, various modifications and other embodiments based on the technical spirit claimed in the claims shall be included in the present invention as a matter of course.

Example 1, Example 2, Example 3

Commercially available 4N grade ruthenium powder (low oxygen product) was introduced into an ultrahigh vacuum chamber, and the ruthenium powder was subject to high output infrared lamp heating in order to eliminate oxygen. The oxygen concentration of the raw material Ru powder was 1200 ppm, and the grain size was 1.5 μm. The temperature of the powder was approximately 1200° C. Heating was stopped after using an oxygen monitor connected to the chamber to confirm that oxygen was sufficiently discharged, and the ruthenium powder was thereafter quenched and cooled to room temperature.

Subsequently, the ruthenium power was placed in a container, argon gas was introduced therein, an EB (electron beam) melted ingot was pulverized through repeated hydrogenation and dehydrogenation, and 4N grade tungsten powder, tantalum powder, and hafnium powder classified into 35 mesh to 200 mesh were changed to respectively be an additive amount of 5at %, 15 at %, and 30 at %, and then mixed with the ruthenium powder. The oxygen concentration of the tungsten raw material powder was 20 ppm, the oxygen concentration of the tantalum raw material powder was 80 ppm, and the oxygen concentration of the hafnium raw material powder was 130 ppm.

The mixed powders were subject to deoxidation treatment at 1100° C. once again, hot pressed in a vacuum at 1600° C., and further subject to hot isostatic press treatment in order to prepare a sintered compact. The results are shown in Table 1.

As shown in Table 1, the additive amounts of tungsten shown in Example 1, tantalum shown in Example 2, and hafnium shown in Example 3 were respectively changed to 5 at %, 15 at %, and 30 at %. Consequently, the density of the sintered compacts was in the range of 99.1 to 99.8%, and all exceeded 99%.

In addition, the oxygen concentration was in the range of 40 to 220 wtppm, and a low oxygen content was achieved. The average grain size of the ruthenium matrix structure as the major component was in the range of 8 to 22 μm. The average grain sizes of the granular minor component metal phase, or the alloy phase or compound phase of the major and the minor component (hereinafter referred to as the "minor component metal phase") of particular importance all satisfied the conditions of the present invention.

As shown in FIG. 1, the metal phases composed of the granular minor component were evenly scattered. FIG. 1 is a diagram showing the structure of the refractory metal target of Example 1-2 described below.

In Examples 1 to 3, the density of all targets was within the range of 98 wt % or higher, and the oxygen content was within the range of 40 to 220 wtppm.

In Example 1-1 (Indicated as "Ex, 1-1" in Table 1; hereinafter the same), the size of the W metal phase composed of the granular minor component was 147 μm, and an alloy phase (alloy phase of major and minor component) or a compound phase having an average thickness of 60 μm was formed at the periphery of the minor component metal phase.

Consequently, a superior Ru-5 at % W target with superior workability, no generation of arcing, and generation of particles at $3\times10^{-3}$ particles/cm$^2$ was obtained.

Incidentally, in cases where the average width of the alloy phase or the compound phase was 5 μm or less or not formed at all, although these cases are not illustrated as examples, the generation of particles tended to increase slightly. However, the amount of increase was minimal, and was not at a problematic level.

Although the existence of the alloy phase or the compound phase of the major component formed at the periphery of the granular minor component is a more preferable mode, it has been confirmed that the size of the overall granular minor component is subject to the greatest influence. The following Examples showed the same tendency. Thus, below, the explanation will be omitted for cases where the average width of the alloy phase or the compound phase formed at the periphery of the minor component metal phase is 5 μm or less.

In Example 1-2, the size of the W metal phase composed of the granular minor component was 133 μm, and an alloy phase (alloy phase of major and minor component) or a compound phase having an average thickness of 52 μm was formed at the periphery of the minor component metal phase.

Consequently, a superior Ru-15 at % W target with superior workability, no generation of arcing, and generation of particles at $4\times10^{-3}$ particles/cm$^2$ was obtained.

In Example 1-3, the size of the W metal phase composed of the granular minor component was 139 μm, and an alloy phase (alloy phase of major and minor component) or a compound phase having an average thickness of 56 μm was formed at the periphery of the minor component metal phase.

Consequently, a favorable Ru-30 at % W target with favorable workability, no generation of arcing, and generation of particles at $9\times10^{-3}$ particles/cm$^2$ was obtained.

In Example 2-1, the size of the Ta metal phase composed of the granular minor component was 124 μm, and an alloy phase (alloy phase of major and minor component) or a compound phase having an average thickness of 48 μm was formed at the periphery of the minor component Ta metal phase. Consequently, a superior Ru-5 at % Ta target with superior workability, no generation of arcing, and generation of particles at $4\times10^{-3}$ particles/cm$^2$ was obtained.

In Example 2-2, the size of the Ta metal phase composed of the granular minor component was 131 μm, and an alloy phase (alloy phase of major and minor component) or a compound phase having an average thickness of 39 μm was formed at the periphery of the minor component Ta metal phase. Consequently, a superior Ru-15 at % Ta target with favorable workability, no generation of arcing, and generation of particles at $9\times10^{-3}$ particles/cm$^2$ was obtained.

In Example 2-3, the size of the Ta metal phase composed of the granular minor component was 118 μm, and an alloy phase (alloy phase of major and minor component) or a compound phase having an average thickness of 30 μm was formed at the periphery of the minor component Ta metal phase. Consequently, a favorable Ru-30 at % Ta target with favorable workability, no generation of arcing, and generation of particles at $4\times10^{-3}$ particles/cm$^2$ was obtained.

In Example 3-1, the size of the Hf metal phase composed of the granular minor component was 185 μm, and an alloy phase (alloy phase of major and minor component) or a compound phase of an average thickness of 9 μm was formed at the periphery of the minor component Hf metal phase. Consequently, a superior Ru-5 at % Hf target with favorable workability, no generation of arcing, and generation of particles at $10\times10^{-3}$ particles/cm$^2$ was obtained.

In Example 3-2, the size of the Hf metal phase composed of the granular minor component was 192 μm, and an alloy phase (alloy phase of major and minor component) or a compound phase of an average thickness of 10 μm was formed at the periphery of the minor component Hf metal phase. Consequently, a superior Ru-15 at % Hf target with favorable workability, no generation of arcing, and generation of particles at $13\times10^{-3}$ particles/cm$^2$ was obtained.

In Example 3-3, the size of the Hf metal phase composed of the granular minor component was 210 μm, and an alloy phase (alloy phase of major and minor component) or a compound phase having an average thickness of 11 μm was formed at the periphery of the minor component Hf metal phase. Consequently, a favorable Ru-30 at % Hf target with favorable workability, no generation of arcing, and generation of particles at $14\times10^{-3}$ particles/cm$^2$ was obtained.

The foregoing results are shown in Table 1. The term "average grain size of minor component phase" in Table 1 shall mean the average grain size of particles including the overall "minor component metal phase, or the alloy phase or compound phase of the major and minor component." This also applies to Table 2 and Table 3.

TABLE 1

| | Major Component | | | Additive | Additive Amount (at %) | Average Size of Minor Component Metal Phase(μm) | Workability | Arcing | Particles ($\times10^{-3}$ pcs/cm$^2$) |
|---|---|---|---|---|---|---|---|---|---|
| Example | Ru | Example 1 | Ex 1-1 | W | 5 | 147 | ◎ | NO | 3 |
| | | | Ex 1-2 | | 15 | 133 | ◎ | NO | 4 |
| | | | Ex 1-3 | | 30 | 139 | ○ | NO | 9 |
| | | Example 2 | Ex 2-1 | Ta | 5 | 124 | ◎ | NO | 4 |
| | | | Ex 2-2 | | 15 | 131 | ○ | NO | 9 |
| | | | Ex 2-3 | | 30 | 118 | ○ | NO | 4 |
| | | Example 3 | Ex 3-1 | Hf | 5 | 185 | ○ | NO | 10 |
| | | | Ex 3-2 | | 15 | 192 | ○ | NO | 13 |
| | | | Ex 3-3 | | 30 | 210 | ○ | NO | 14 |
| Comparative Example | Ru | Comparative Example 1 | Comparative Ex 1-1 | W | 5 | 90 | ○ | NO | 21 |
| | | | Comparative Ex 1-2 | | 15 | 72 | Δ | NO | 32 |
| | | | Comparative Ex 1-3 | | 30 | 61 | X | YES | 47 |

TABLE 1-continued

| Major Component | | Additive | Additive Amount (at %) | Average Size of Minor Component Metal Phase(μm) | Workability | Arcing | Particles ($\times 10^{-3}$ pcs/cm$^2$) |
|---|---|---|---|---|---|---|---|
| Comparative Example 2 | Comparative Ex 2-1 | Ts | 5 | 53 | Δ | YES | 49 |
| | Comparative Ex 2-2 | | 15 | 64 | X | YES | 58 |
| | Comparative Ex 2-3 | | 30 | 33 | X | YES | 89 |
| Comparative Example 3 | Comparative Ex 3-1 | Hf | 5 | 26 | X | YES | 52 |
| | Comparative Ex 3-2 | | 15 | 16 | X | YES | 69 |
| | Comparative Ex 3-3 | | 30 | 11 | X | YES | 84 |

Comparative Example 1, Comparative Example 2, Comparative Example 3

Mixed powders were prepared as with the foregoing Examples 1 to 3. However, the tungsten powder, the tantalum powder, and the hafnium powder were classified into 200 mesh or less and used. The mixed powders were hot pressed in a vacuum at 1600° C., and further subject to hot isostatic press treatment in order to prepare a sintered compact. The results are shown in Table 1.

As shown in Table 1, the additive amounts of tungsten shown in Comparative Example 1, tantalum shown in Comparative Example 2, and hafnium shown in Comparative Example 3 were respectively changed to 5 at %, 15 at %, and 30 at %. Consequently, the density of the sintered compacts was in the range of 98.3 to 99.6%, and all exceeded 98%.

The oxygen concentration was within the range of 350 to 1960 wtppm, and the oxygen content was fairly high. The average grain size of the ruthenium matrix structure as the major component was in the range of 6 to 21 μm. The average grain sizes of the granular minor component metal phase, or the alloy phase or compound phase of the major and the minor component (hereinafter referred to as the "minor component metal phase") of particular importance were small, and none satisfied the conditions of the present invention.

As described above, with the Comparative Examples 1 to 3, the density of all targets was in the range of 98 wt % or higher, the oxygen content was in the range of 350 to 1960 wtppm, and the oxygen content was high.

In Comparative Example 1-1 (Indicated as "Comparative Ex. 1-1" in Table 1; hereinafter the same), the size of the W metal phase composed of the granular minor component was 90 μm, and did not satisfy the condition of the present invention. Moreover, an alloy phase (alloy phase of major and minor component) or a compound phase having an average thickness of 35 μm was slightly formed at the periphery of the minor component metal phase. Consequently, an inferior Ru-5 at % W target in comparison to the Examples having favorable workability, no generation of arcing, but with generation of particles at $21 \times 10^{-3}$ particles/cm$^2$ was obtained.

Incidentally, in cases where the average width of the alloy phase or the compound phase was 5 μm or less or not formed at all, although these cases are not illustrated as examples, the generation of particles tended to increase slightly. The following Comparative Examples showed the same tendency. Thus, below, the explanation will be omitted for cases where the average width of the alloy phase or the compound phase formed at the periphery of the minor component metal phase is 5 μm or less.

In Comparative Example 1-2, the size of the W metal phase composed of the granular minor component was 72 μm, and did not satisfy the condition of the present invention. Moreover, although an alloy phase (alloy phase of major and minor component) or a compound phase having an average thickness of 28 μm was formed at the periphery of the minor component metal phase, an inferior Ru-15 at % W target in comparison to the Examples having inferior workability, no generation of arcing, but with generation of particles at $32 \times 10^{-3}$ particles/cm$^2$ was obtained.

In Comparative Example 1-3, the size of the W metal phase composed of the granular minor component was 61 μm, and did not satisfy the condition of the present invention. Moreover, although an alloy phase (alloy phase of major and minor component) or a compound phase having an average thickness of 24 μm was formed at the periphery of the minor component metal phase, the workability was inferior. An inferior Ru-30 at % W target in comparison to the Examples having generation of arcing, and with increased generation of particles at $47 \times 10^{-3}$ particles/cm$^2$ was obtained.

In Comparative Example 2-1, the size of the Ta metal phase composed of the granular minor component was 53 μm, and did not satisfy the condition of the present invention. Moreover, although an alloy phase (alloy phase of major and minor component) or a compound phase having an average thickness of 15 μm was slightly formed at the periphery of the minor component Ta metal phase, an inferior Ru-5 at % Ta target in comparison to the Examples having unfavorable workability, with generation of arcing, and generation of particles at $49 \times 10^{-3}$ particles/cm$^2$ was obtained.

In Comparative Example 2-2, the size of the Ta metal phase composed of the granular minor component was 64 μm, and did not satisfy the condition of the present invention. Moreover, although an alloy phase (alloy phase of major and minor component) or a compound phase having an average thickness of 18 μm was slightly formed at the periphery of the minor component Ta metal phase, an inferior Ru-15 at % Ta target in comparison to the Examples having unfavorable workability, with generation of arcing, and generation of particles at $58 \times 10^{-3}$ particles/cm$^2$ was obtained.

In Comparative Example 2-3, the size of the Ta metal phase composed of the granular minor component was 33 μm, and did not satisfy the condition of the present invention. Moreover, although an alloy phase (alloy phase of major and minor component) or a compound phase having an average thickness of 9 μm was slightly formed at the periphery of the minor component Ta metal phase, an inferior Ru-30 at % Ta target in comparison to the Examples having unfavorable workability, with generation of arcing, and significant generation of particles at $89 \times 10^{-3}$ was obtained.

In Comparative Example 3-1, the size of the Hf metal phase composed of the granular minor component was 26 μm, and did not satisfy the condition of the present invention. Moreover, although an alloy phase (alloy phase of major and minor component) or a compound phase having an average thickness of 1 μm was slightly formed at the periphery of the minor component Hf metal phase, an inferior Ru-5 at % Hf target in comparison to the Examples having unfavorable workability, with generation of arcing, and immense generation of particles at $52 \times 10^{-3}$ particles/cm$^2$ was obtained.

In Comparative Example 3-2, the size of the Hf metal phase composed of the granular minor component was 16 μm, and did not satisfy the condition of the present invention. Moreover, although an alloy phase (alloy phase of major and minor component) or a compound phase having an average thickness of 16 μm was slightly formed at the periphery of the minor component Hf metal phase, an inferior Ru-15 at % Hf target in comparison to the Examples having unfavorable workability, with generation of arcing, and immense generation of particles at $69 \times 10^{-3}$ particles/cm$^2$ was obtained.

In Comparative Example 3-3, the size of the Hf metal phase composed of the granular minor component was 11 μm, and did not satisfy the condition of the present invention. Moreover, although an alloy phase (alloy phase of major and minor component) or a compound phase having an average thickness of 1 μm was slightly formed at the periphery of the minor component Hf metal phase, an inferior Ru-30 at % Hf target in comparison to the Examples having unfavorable workability, with generation of arcing, and abnormal generation of particles at $84 \times 10^{-3}$ particles/cm$^2$ was obtained.

The results of Comparative Example 1 to Comparative Example 3 are similarly shown in Table 1.

Example 4, Example 5, Example 6

Commercially available 4N grade rhodium powder (low oxygen product: Rh) was introduced into an ultrahigh vacuum chamber, and the Rh powder was subject to high output infrared lamp heating in order to eliminate oxygen. The oxygen concentration of the raw material Rh powder was 900 ppm, and the grain size was 2.2 μm. The temperature of the powder was approximately 1200° C. Heating was stopped after using an oxygen monitor connected to the chamber to confirm that oxygen was sufficiently discharged, and the ruthenium powder was thereafter quenched and cooled to room temperature.

Subsequently, the rhodium power was placed in a container, argon gas was introduced therein, an EB (electron beam) melted tantalum ingot was pulverized through repeated hydrogenation and dehydrogenation, and 4N grade tungsten powder, tantalum powder, and hafnium powder classified into 50 mesh to 200 mesh were changed to respectively be an additive amount of 5 at %, 15 at %, and 30 at %, and then mixed with the rhodium powder. The oxygen concentration of the tungsten raw material powder was 20 ppm, the oxygen concentration of the tantalum raw material powder was 80 ppm, and the oxygen concentration of the hafnium raw material powder was 130 ppm.

The mixed powders were subject to deoxidation treatment at 1100° C. once again, hot pressed in a vacuum at 1600° C., and further subject to hot isostatic press treatment in order to prepare a sintered compact. The results are shown in Table 2.

As shown in Table 2, the additive amounts of tungsten shown in Example 4, tantalum shown in Example 5, and hafnium shown in Example 6 were respectively changed to 5 at %, 15 at %, and 30 at %. Consequently, the density of the sintered compacts was in the range of 98.0 to 99.8%, and all exceeded 98%.

In addition, the oxygen concentration was in the range of 40 to 260 wtppm, and a low oxygen content was achieved.

The average grain size of the rhodium matrix structure as the major component was in the range of 13 to 34 μm.

The average grain sizes of the granular minor component metal phase, or the alloy phase or compound phase of the major and the minor component (hereinafter referred to as the "minor component metal phase") of particular importance all satisfied the conditions of the present invention. The metal phases composed of the granular minor component were evenly scattered in the structure (matrix) as the major component.

As described above, in Examples 4 to 6, the density of all targets was within the range of 98 wt % or higher (excluding gas components and other impurities), and the oxygen content was within the range of 40 to 260 wtppm.

In Example 4-1 (Indicated as "Ex. 4-1" in Table 2; hereinafter the same), the size of the W metal phase composed of the granular minor component was 138 μm, and an alloy phase (alloy phase of major and minor component) or a compound phase having an average thickness of 27 μm was formed at the periphery of the minor component metal phase. Consequently, a superior Rh-5 at % W target with superior workability, no generation of arcing, and generation of particles at $6 \times 10^{-3}$ particles/cm$^2$ was obtained.

Incidentally, in cases where the average width of the alloy phase or the compound phase was 5 μm or less or not formed at all, although these cases are not illustrated as examples, the generation of particles tended to increase slightly. However, the amount of increase was minimal, and was not at a problematic level.

Although the existence of the alloy phase or the compound phase of the major component formed at the periphery of the granular minor component is a more preferable mode, it has been confirmed that the size of the overall granular minor component is subject to the greatest influence. The following Examples showed the same tendency. Thus, below, the explanation will be omitted for cases where the average width of the alloy phase or the compound phase formed at the periphery of the minor component metal phase is 5 μm or less.

In Example 4-2, the size of the W metal phase composed of the granular minor component was 130 μm, and an alloy phase (alloy phase of major and minor component) or a compound phase having an average thickness of 26 μm was formed at the periphery of the minor component metal phase. Consequently, a superior Rh-15 at % W target with superior workability, no generation of arcing, and generation of particles at $7 \times 10^{-3}$ particles/cm$^2$ was obtained.

In Example 4-3, the size of the W metal phase composed of the granular minor component was 130 μm, and an alloy phase (alloy phase of major and minor component) or a compound phase having an average thickness of 25 μm was formed at the periphery of the minor component metal phase. Consequently, a favorable Rh-30 at % W target with superior workability, no generation of arcing, and generation of particles at $12 \times 10^{-3}$ particles/cm$^2$ was obtained.

In Example 5-1, the size of the Ta metal phase composed of the granular minor component was 136 μm, and an alloy phase (alloy phase of major and minor component) or a compound phase having an average thickness of 30 μm was formed at the periphery of the minor component metal phase. Consequently, a superior Rh-5 at % Ta target with superior workability, no generation of arcing, and generation of particles at $3 \times 10^{-3}$ particles/cm$^2$ was obtained.

In Example 5-2, the size of the Ta metal phase composed of the granular minor component was 118 μm, and an alloy phase (alloy phase of major and minor component) or a compound phase having an average thickness of 22 μm was formed at the periphery of the minor component metal phase. Consequently, a superior Rh-15 at % Ta target with favorable workability, no generation of arcing, and generation of particles at $4 \times 10^{-3}$ particles/cm$^2$ was obtained.

In Example 5-3, the size of the Ta metal phase composed of the granular minor component was 169 μm, and an alloy phase (alloy phase of major and minor component) or a compound phase having an average thickness of 30 μm was formed at the periphery of the minor component metal phase. Consequently, a favorable Rh-30 at % Ta target with favorable workability, no generation of arcing, and generation of particles at $9 \times 10^{-3}$ particles/cm$^2$ was obtained.

In Example 6-1, the size of the Hf metal phase composed of the granular minor component was 209 μm, and an alloy phase (alloy phase of major and minor component) or a compound phase having an average thickness of 10 μm was formed at the periphery of the minor component metal phase. Consequently, a superior Rh-5 at % Hf target with favorable workability, no generation of arcing, and generation of particles at $6 \times 10^{-3}$ particles/cm$^2$ was obtained.

In Example 6-2, the size of the Hf metal phase composed of the granular minor component was 162 μm, and an alloy phase (alloy phase of major and minor component) or a compound phase having an average thickness of 8 μm was formed at the periphery of the minor component metal phase. Consequently, a superior Rh-15 at % Hf target with favorable workability, no generation of arcing, and generation of particles at $9 \times 10^{-3}$ particles/cm$^2$ was obtained.

In Example 6-3, the size of the Hf metal phase composed of the granular minor component was 208 μm, and an alloy phase (alloy phase of major and minor component) or a compound phase having an average thickness of 9 μm was formed at the periphery of the minor component metal phase. Consequently, a favorable Rh-30 at % Hf target with favorable workability, no generation of arcing, and generation of particles at $14 \times 10^{-3}$ particles/cm$^2$ was obtained.

The foregoing results are shown in Table 2.

mesh or less and used. The mixed powders were hot pressed in a vacuum at 1600° C., and further subject to hot isostatic press treatment in order to prepare a sintered compact. The results are shown in Table 2.

As shown in Table 2, the additive amounts of tungsten shown in Comparative Example 4, tantalum shown in Comparative Example 5, and hafnium shown in Comparative Example 6 were respectively changed to 5 at %, 15 at %, and 30 at %. Consequently, the density of the sintered compacts was in the range of 96.3 to 99.9%, and the addition of Hf caused a significant decrease in density, and in certain cases the density fell below 98%.

The oxygen concentration was within the range of 500 to 2220 wtppm, and the oxygen content was fairly high. The average grain size of the rhodium matrix structure as the major component was in the range of 6 to 28 μm. The average grain sizes of the granular minor component metal phase of particular importance were in the range of 21 μm to 93 μm, and were all outside the scope of the present invention. The details are described below.

As described above, with the Comparative Examples 4 to 6, the density of all targets was in the range of 98 wt % or higher, but the oxygen content was in the range of 500 to 2220 wtppm, and the oxygen content was high.

In Comparative Example 4-1 (Indicated as "Comparative Ex. 4-1" in Table 2; hereinafter the same), the size of the W metal phase composed of the granular minor component was 53 μm, and did not satisfy the condition of the present invention. Moreover, although an alloy phase (alloy phase of major and minor component) or a compound phase having an average thickness of 10 μm was slightly formed at the periphery of

TABLE 2

| | Major Component | | | Additive | Additive Amount (at %) | Average Size of Minor Component Metal Phase(μm) | Workability | Arcing | Particles ($\times 10^{-3}$ pcs/cm$^2$) |
|---|---|---|---|---|---|---|---|---|---|
| Example | Rh | Example 4 | Ex 4-1 | W | 5 | 138 | ⊚ | NO | 6 |
| | | | Ex 4-2 | | 15 | 130 | ⊚ | NO | 7 |
| | | | Ex 4-3 | | 30 | 165 | ⊚ | NO | 12 |
| | | Example 5 | Ex 5-1 | Ta | 5 | 136 | ⊚ | NO | 3 |
| | | | Ex 5-2 | | 15 | 118 | ⊚ | NO | 4 |
| | | | Ex 5-3 | | 30 | 169 | ○ | NO | 9 |
| | | Example 6 | Ex 6-1 | Hf | 5 | 209 | ○ | NO | 6 |
| | | | Ex 6-2 | | 15 | 162 | ○ | NO | 9 |
| | | | Ex 6-3 | | 30 | 208 | ○ | NO | 14 |
| Comparative Example | Rh | Comparative Example 4 | Comparative Ex 4-1 | W | 5 | 53 | ○ | NO | 26 |
| | | | Comparative Ex 4-2 | | 15 | 64 | ○ | YES | 54 |
| | | | Comparative Ex 4-3 | | 30 | 32 | Δ | YES | 57 |
| | | Comparative Example 5 | Comparative Ex 5-1 | Ta | 5 | 93 | Δ | YES | 57 |
| | | | Comparative Ex 5-2 | | 15 | 78 | Δ | YES | 78 |
| | | | Comparative Ex 5-3 | | 30 | 85 | X | YES | 89 |
| | | Comparative Example 6 | Comparative Ex 6-1 | Hf | 5 | 44 | Δ | YES | 65 |
| | | | Comparative Ex 6-2 | | 15 | 21 | X | YES | 67 |
| | | | Comparative Ex 6-3 | | 30 | 30 | X | YES | 91 |

Comparative Example 4, Comparative Example 5, Comparative Example 6

Mixed powders were prepared as with the foregoing Examples 4 to 6. However, the tungsten powder, the tantalum powder, and the hafnium powder were classified into 200 the minor component metal phase, an inferior Rh-5 at % W target in comparison to the Examples having somewhat favorable workability, no generation of arcing, but with generation of particles at $26 \times 10^{-3}$ particles/cm$^2$ was obtained.

Incidentally, in cases where the average width of the alloy phase or the compound phase was 5 μm or less or not formed at all, although these cases are not illustrated as examples, the generation of particles tended to increase slightly. The following Comparative Examples showed the same tendency. Thus, below, the explanation will be omitted for cases where the average width of the alloy phase or the compound phase formed at the periphery of the minor component metal phase is 5 μm or less.

In Comparative Example 4-2, the size of the W metal phase composed of the granular minor component was 64 μm, and did not satisfy the condition of the present invention. Moreover, although an alloy phase (alloy phase of major and minor component) or a compound phase having an average thickness of 12 μm was formed at the periphery of the minor component metal phase, an inferior Rh-15 at % W target in comparison to the Examples having favorable workability, but with generation of arcing, and generation of particles at $54 \times 10^{-3}$ particles/cm$^2$ was obtained.

In Comparative Example 4-3, the size of the W metal phase composed of the granular minor component was 64 μm, and did not satisfy the condition of the present invention. Moreover, although an alloy phase (alloy phase of major and minor component) or a compound phase having an average thickness of 12 μm was formed at the periphery of the minor component metal phase, an inferior Rh-30 at % W target in comparison to the Examples having inferior workability, with generation of arcing, and increased generation of particles at $57 \times 10^{-3}$ particles/cm$^2$ was obtained.

In Comparative Example 5-1, the size of the Ta metal phase composed of the granular minor component was 93 μm, and did not satisfy the condition of the present invention. Moreover, although an alloy phase (alloy phase of major and minor component) or a compound phase having an average thickness of 19 μm was formed at the periphery of the minor component metal phase, an inferior Rh-5 at % Ta target in comparison to the Examples having inferior workability, with generation of arcing, and generation of particles at $57 \times 10^{-3}$ particles/cm$^2$ was obtained.

In Comparative Example 5-2, the size of the Ta metal phase composed of the granular minor component was 78 μm, and did not satisfy the condition of the present invention. Moreover, although an alloy phase (alloy phase of major and minor component) or a compound phase having an average thickness of 14 μm was formed at the periphery of the minor component metal phase, an inferior Rh-15 at % Ta target in comparison to the Examples having inferior workability, with generation of arcing, and generation of particles at $78 \times 10^{-3}$ particles/cm$^2$ was obtained.

In Comparative Example 5-3, the size of the Ta metal phase composed of the granular minor component was 85 μm, and did not satisfy the condition of the present invention. Moreover, although an alloy phase (alloy phase of major and minor component) or a compound phase having an average thickness of 15 μm was formed at the periphery of the minor component metal phase, an inferior Rh-30 at % Ta target in comparison to the Examples having inferior workability, with generation of arcing, and significant generation of particles at $89 \times 10^{-3}$ particles/cm$^2$ was obtained.

In Comparative Example 6-1, the size of the Hf metal phase composed of the granular minor component was 44 μm, and did not satisfy the condition of the present invention. Moreover, although an alloy phase (alloy phase of major and minor component) or a compound phase having an average thickness of 2 μm was formed at the periphery of the minor component metal phase, an inferior Rh-5 at % Hf target in comparison to the Examples having inferior workability, with generation of arcing, and immense generation of particles at $65 \times 10^{-3}$ particles/cm$^2$ was obtained.

In Comparative Example 6-2, the size of the Hf metal phase composed of the granular minor component was 21 μm, and did not satisfy the condition of the present invention. Moreover, although an alloy phase (alloy phase of major and minor component) or a compound phase having an average thickness of 1 μm was formed at the periphery of the minor component metal phase, an inferior Rh-15 at % Hf target in comparison to the Examples having inferior workability, with generation of arcing, and immense generation of particles at $67 \times 10^{-3}$ particles/cm$^2$ was obtained.

In Comparative Example 6-3, the size of the Hf metal phase composed of the granular minor component was 30 μm, and did not satisfy the condition of the present invention. Moreover, although an alloy phase (alloy phase of major and minor component) or a compound phase having an average thickness of 2 μm was formed at the periphery of the minor component metal phase, an inferior Rh-30 at % Hf target in comparison to the Examples having inferior workability, with generation of arcing, and abnormal generation of particles at $91 \times 10^{-3}$ particles/cm$^2$ was obtained.

The results of Comparative Example 4 to Comparative Example 6 are similarly shown in Table 2.

Example 7, Example 8, Example 9

Commercially available 4N grade iridium powder (low oxygen product: Ir) was introduced into an ultrahigh vacuum chamber, and the iridium powder was subject to high output infrared lamp heating in order to eliminate oxygen. The oxygen concentration of the raw material Ir powder was 1800 ppm, and the grain size was 1.8 μm. The temperature of the powder was approximately 1200° C. Heating was stopped after using an oxygen monitor connected to the chamber to confirm that oxygen was sufficiently discharged, the iridium powder was thereafter quenched and cooled to room temperature.

Subsequently, the iridium power was placed in a container, argon gas was introduced therein, an EB (electron beam) melted tantalum ingot was pulverized through repeated hydrogenation and dehydrogenation, and 4N grade tungsten powder, tantalum powder, and hafnium powder classified into 50 mesh to 200 mesh were changed to respective be an additive amount of 5 at %, 15 at %, and 30 at %, and then mixed with the iridium powder. The oxygen concentration of the tungsten raw material powder was 20 ppm, the oxygen concentration of the tantalum raw material powder was 80 ppm, and the oxygen concentration of the hafnium raw material powder was 130 ppm.

The mixed powders were subject to deoxidation treatment at 1100° C. once again, hot pressed in a vacuum at 1600° C., and further subject to hot isostatic press treatment in order to prepare a sintered compact. The results are shown in Table 3.

As shown in Table 3, the additive amounts of tungsten shown in Example 7, tantalum shown in Example 8, and hafnium shown in Example 9 were respectively changed to 5 at %, 15 at %, and 30 at %. Consequently, the density of the sintered compacts was in the range of 98.7 to 99.9%, and all exceeded 98%.

In addition, the oxygen concentration was in the range of 30 to 220 wtppm, and a low oxygen content was achieved. The average grain size of the iridium matrix structure as the major component was in the range of 11 to 30 μm. The average grain sizes of the granular minor component metal phase of particular importance were in the range of 122 μm to 212 μm, and all satisfied the conditions of the present invention.

As described above, in Examples 7 to 9, the density of all targets was within the range of 98 wt % or higher (excluding gas components and other impurities), and the oxygen content was within the range of 30 to 220 wtppm.

In Example 7-1 (Indicated as "Ex. 7-1" in Table 3; hereinafter the same), the size of the W metal phase composed of the granular minor component was 128 μm, and an alloy phase (alloy phase of major and minor component) or a compound phase having an average thickness of 25 μm was formed at the periphery of the minor component metal phase. Consequently, a superior Ir-5 at % W target with superior workability, no generation of arcing, and generation of particles at $13 \times 10^{-3}$ particles/cm$^2$ was obtained.

Incidentally, in cases where the average width of the alloy phase or the compound phase was 5 μm or less or not formed at all, although these cases are not illustrated as examples, the generation of particles tended to increase slightly. However, the amount of increase was minimal, and was not at a problematic level.

Although the existence of the alloy phase or the compound phase of the major component formed at the periphery of the granular minor component is a more preferable mode, it has been confirmed that the size of the overall granular minor component is subject to the greatest influence. The following Examples showed the same tendency. Thus, below, the explanation will be omitted for cases where the average width of the alloy phase or the compound phase formed at the periphery of the minor component metal phase is 5 μm or less.

In Example 7-2, the size of the W metal phase composed of the granular minor component was 122 μm, and an alloy phase (alloy phase of major and minor component) or a compound phase having an average thickness of 22 μm was formed at the periphery of the minor component metal phase. Consequently, a superior Ir-15 at % W target with superior workability, no generation of arcing, and generation of particles at $12 \times 10^{-3}$ particles/cm$^2$ was obtained.

In Example 7-3, the size of the W metal phase composed of the granular minor component was 161 μm, and an alloy phase (alloy phase of major and minor component) or a compound phase having an average thickness of 32 μm was formed at the periphery of the minor component metal phase. Consequently, a favorable Ir-30 at % W target with superior workability, no generation of arcing, and generation of particles at $9 \times 10^{-3}$ particles/cm$^2$ was obtained.

In Example 8-1, the size of the Ta metal phase composed of the granular minor component was 149 μm, and an alloy phase (alloy phase of major and minor component) or a compound phase having an average thickness of 15 μm was formed at the periphery of the minor component metal phase. Consequently, a superior Ir-5 at % Ta target with superior workability, no generation of arcing, and generation of particles at $7 \times 10^{-3}$ particles/cm$^2$ was obtained.

In Example 8-2, the size of the Ta metal phase composed of the granular minor component was 170 μm, and an alloy phase (alloy phase of major and minor component) or a compound phase having an average thickness of 17 μm was formed at the periphery of the minor component metal phase. Consequently, a superior Ir-15 at % Ta target with favorable workability, no generation of arcing, and generation of particles at $5 \times 10^{-3}$ particles/cm$^2$ was obtained.

In Example 8-3, the size of the Ta metal phase composed of the granular minor component was 179 μm, and an alloy phase (alloy phase of major and minor component) or a compound phase having an average thickness of 18 μm was formed at the periphery of the minor component metal phase. Consequently, a favorable Ir-30 at % Ta target with favorable workability, no generation of arcing, and generation of particles at $5 \times 10^{-3}$ particles/cm$^2$ was obtained.

In Example 9-1, the size of the Hf metal phase composed of the granular minor component was 196 μm, and an alloy phase (alloy phase of major and minor component) or a compound phase having an average thickness of 7 μm was formed at the periphery of the minor component metal phase. Consequently, a superior Ir-5 at % Hf target with favorable workability, no generation of arcing, and generation of particles at $5 \times 10^{-3}$ particles/cm$^2$ was obtained.

In Example 9-2, the size of the Hf metal phase composed of the granular minor component was 182 μm, and an alloy phase (alloy phase of major and minor component) or a compound phase having an average thickness of 6 μm was formed at the periphery of the minor component metal phase. Consequently, a superior Ir-15 at % Hf target with favorable workability, no generation of arcing, and generation of particles at $6 \times 10^{-3}$ particles/cm$^2$ was obtained.

In Example 9-3, the size of the Hf metal phase composed of the granular minor component was 212 μm, and an alloy phase (alloy phase of major and minor component) or a compound phase having an average thickness of 11 μm was formed at the periphery of the minor component metal phase. Consequently, a favorable Ir-30 at % Hf target with favorable workability, no generation of arcing, and generation of particles at $8 \times 10^{-3}$ particles/cm$^2$ was obtained.

The foregoing results are shown in Table 3.

TABLE 3

| | Major Component | | | Additive | Additive Amount (at %) | Average Size of Minor Component Metal Phase(μm) | Workability | Arcing | Particles ($\times 10^{-3}$ pcs/cm$^2$) |
|---|---|---|---|---|---|---|---|---|---|
| Example | Ir | Example 7 | Ex 7-1 | W | 5 | 128 | ◎ | NO | 13 |
| | | | Ex 7-2 | | 15 | 122 | ◎ | NO | 12 |
| | | | Ex 7-3 | | 30 | 161 | ○ | NO | 9 |
| | | Example 8 | Ex 8-1 | Ta | 5 | 149 | ◎ | NO | 7 |
| | | | Ex 8-2 | | 15 | 170 | ○ | NO | 5 |
| | | | Ex 8-3 | | 30 | 179 | ○ | NO | 3 |
| | | Example 9 | Ex 9-1 | Hf | 5 | 196 | ○ | NO | 5 |
| | | | Ex 9-2 | | 15 | 182 | ○ | NO | 6 |
| | | | Ex 9-3 | | 30 | 212 | ○ | NO | 8 |
| Comparative Example | Ir | Comparative Example 7 | Comparative Ex 7-1 | W | 5 | 52 | ○ | NO | 33 |
| | | | Comparative Ex 7-2 | | 15 | 62 | Δ | NO | 28 |
| | | | Comparative Ex 7-3 | | 30 | 63 | Δ | YES | 85 |

TABLE 3-continued

| Major Component | | Additive | Additive Amount (at %) | Average Size of Minor Component Metal Phase(μm) | Workability | Arcing | Particles (×10$^{-3}$ pcs/cm$^2$) |
|---|---|---|---|---|---|---|---|
| | Comparative Example 8 | Comparative Ex 8-1 | Ta | 5 | 41 | Δ | NO | 39 |
| | | Comparative Ex 8-2 | | 15 | 42 | X | NO | 35 |
| | | Comparative Ex 8-3 | | 30 | 28 | X | YES | 76 |
| | Comparative Example 9 | Comparative Ex 9-1 | Hf | 5 | 36 | X | YES | 52 |
| | | Comparative Ex 9-2 | | 15 | 27 | X | YES | 77 |
| | | Comparative Ex 9-3 | | 30 | 28 | X | YES | 103 |

Comparative Example 7, Comparative Example 8, Comparative Example 9

Mixed powders were prepared as with the foregoing Examples 7 to 9. However, the tungsten powder, the tantalum powder, and the hafnium powder were classified into 200 mesh or less and used. The mixed powders were hot pressed in a vacuum at 1600° C., and further subject to hot isostatic press treatment in order to prepare a sintered compact. The results are shown in Table 3.

As shown in Table 3, the additive amounts of tungsten shown in Comparative Example 7, tantalum shown in Comparative Example 8, and hafnium shown in Comparative Example 9 were respectively changed to 5 at %, 15 at %, and 30 at %. Consequently, the density of the sintered compacts was in the range of 95.8 to 99.9%, and the addition of Hf caused a significant decrease in density, and in certain cases the density fell below 98%.

The oxygen concentration was within the range of 350 to 2320 wtppm, and the oxygen content was fairly high. The average grain size of the iridium matrix structure as the major component was in the range of 13 to 28 μm. The average grain sizes of the granular minor component metal phase of particular importance were in the range of 27 μm to 63 μm, and were all outside the scope of the present invention. The details are described below.

As described above, with the Comparative Examples 7 to 9, the density of all targets was in the range of 98 wt % or higher, but the oxygen content was in the range of 350 to 2320 wtppm, and the oxygen content was high.

In Comparative Example 7-1 (Indicated as "Comparative Example 7-1" in Table 3; hereinafter the same), the size of the W metal phase composed of the granular minor component was 52 μm, and an alloy phase (alloy phase of major and minor component) or a compound phase having an average thickness of 7 μm was formed at the periphery of the minor component metal phase. Consequently, an inferior Ir-5 at % W target in comparison to the Examples having inferior workability, no generation of arcing, but with generation of particles at 39×10$^{-3}$ particles/cm$^2$ was obtained.

Incidentally, in cases where the average width of the alloy phase or the compound phase was 5 μm or less or not formed at all, although these cases are not illustrated as examples, the generation of particles tended to increase slightly. The following Comparative Examples showed the same tendency. Thus, below, the explanation will be omitted for cases where the average width of the alloy phase or the compound phase formed at the periphery of the minor component metal phase is 5 μm or less.

In Comparative Example 7-2, the size of the W metal phase composed of the granular minor component was 62 μm, and an alloy phase (alloy phase of major and minor component) or a compound phase having an average thickness of 9 μm was formed at the periphery of the minor component metal phase. Consequently, an inferior Ir-15 at % W target in comparison to the Examples having somewhat favorable workability, no generation of arcing, but with generation of particles at 28×10$^{-3}$ particles/cm$^2$ was obtained.

In Comparative Example 7-3, the size of the W metal phase composed of the granular minor component was 63 μm, and an alloy phase (alloy phase of major and minor component) or a compound phase having an average thickness of 9 μm was formed at the periphery of the minor component metal phase. Consequently, an inferior Ir-30 at % W target in comparison to the Examples having somewhat favorable workability, but with generation of arcing, and increased generation of particles at 85×10$^{-3}$ particles/cm$^2$ was obtained.

In Comparative Example 8-1, the size of the Ta metal phase composed of the granular minor component was 41 μm, and an alloy phase (alloy phase of major and minor component) or a compound phase having an average thickness of 4 μm was formed at the periphery of the minor component metal phase. Consequently, an inferior Ir-5 at % Ta target in comparison to the Examples having somewhat favorable workability, no generation of arcing, but with generation of particles at 39×10$^{-3}$ particles/cm$^2$ was obtained.

In Comparative Example 8-2, the size of the Ta metal phase composed of the granular minor component was 42 μm, and an alloy phase (alloy phase of major and minor component) or a compound phase having an average thickness of 4 μm was formed at the periphery of the minor component metal phase. Consequently, an inferior Ir-15 at % Ta target in comparison to the Examples having inferior workability, no generation of arcing, but with generation of particles at 35×10$^{-3}$ particles/cm$^2$ was obtained.

In Comparative Example 8-3, the size of the Ta metal phase composed of the granular minor component was 28 μm, and an alloy phase (alloy phase of major and minor component) or a compound phase having an average thickness of 2 μm was formed at the periphery of the minor component metal phase. Consequently, an inferior Ir-30 at % Ta target in comparison to the Examples having inferior workability, with generation of arcing, and significant generation of particles at 76×10$^{-3}$ particles/cm$^2$ was obtained.

In Comparative Example 9-1, the size of the Hf metal phase composed of the granular, minor component was 36 μm, and an alloy phase (alloy phase of major and minor component) or a compound phase having an average thickness of 1 μm was formed at the periphery of the minor component metal phase. Consequently, an inferior Ir-5 at % Hf target in comparison to the Examples having inferior workability, with generation of arcing, and immense generation of particles at 52×10$^{-3}$ particles/cm$^2$ was obtained.

In Comparative Example 9-2, the size of the Hf metal phase composed of the granular minor component was 27 µm, and an alloy phase (alloy phase of major and minor component) or a compound phase having an average thickness of 1 µm was formed at the periphery of the minor component metal phase. Consequently, an inferior Ir-15 at % Hf target in comparison to the Examples having inferior workability, with generation of arcing, and immense generation of particles at $77 \times 10^{-3}$ particles/cm$^2$ was obtained.

In Comparative Example 9-3, the size of the Hf metal phase composed of the granular minor component was 28 µm, and an alloy phase (alloy phase of major and minor component) or a compound phase having an average thickness of 1 µm was formed at the periphery of the minor component metal phase. Consequently, an inferior Ir-30 at % Hf target in comparison to the Examples having inferior workability, with generation of arcing, and abnormal generation of particles at $103 \times 10^{-3}$ particles/cm$^2$ was obtained.

The results of Comparative Example 7 to Comparative Example 9 are similarly shown in Table 3.

Example 10, Example 11, Example 12

The results concerning workability, arcing, and particle count in the case of changing the average grain size, relative density, oxygen and carbon content of the respective matrixes as Example 10; a case where the conditions of Example 1 in which the W content is 15 at % and the average grain size of the minor component phase is 128 to 135 µm are used, as Example 11; a case where the conditions of Example 2 in which the Ta content is 15 at % and the average grain size of the minor component phase is 131 to 140 µm are used, and as Example 12; a case where the conditions of Example 3 in which the Hf content is 15 at % and the average grain size of the minor component phase is 191 to 202 µm are used, are shown in Table 4.

In Example 10, Example 11, and Example 12 shown in Table 4, there was no generation of arcing. In the case of Example 10 (addition of W), the workability was extremely favorable in all cases, and, although the particle count increased slightly when the oxygen and carbon content increased slightly, all cases showed favorable results.

In the case of Example 11 (addition of Ta), the workability deteriorated slightly when the oxygen and carbon content increased, and the particle count also tended to increase somewhat, but these were not at a problematic level.

In the case of Example 12 (addition of Hf), the average grain size of the minor component phase increased somewhat, the workability deteriorated slightly when the oxygen and carbon content increased, and the particle count also tended to increase slightly, but these were not at a problematic level. Contrarily, when the oxygen and carbon content were reduced, the workability improved and the particle count tended to also decrease.

Accordingly, it could be said that the workability can be improved and the particle count can be reduced by adjusting the average grain size of the minor component phase and reducing the oxygen and carbon content. In particular, it could be said that the oxygen and carbon content should be reduced as much as possible. There was no particular influence regarding the other elements.

TABLE 4

| | Major Component | Additive | Additive Amount (at %) | Average Size of Matrix Phase (µm) | Average Size of Minor Component Metal Phase (µm) | Relative Density (%) | Oxygen Content (wtppm) | Carbon Content (wtppm) | Workability | Arcing | Particles ($\times 10^{-3}$ pcs/cm$^2$) |
|---|---|---|---|---|---|---|---|---|---|---|---|
| Example | Ru | Ex 10 W | 15 | 12 | 128 | 99.2 | 40 | 40 | ◎ | NO | 4 |
| | | | 15 | 9 | 133 | 99.2 | 50 | 40 | ◎ | NO | 4 |
| | | | 15 | 8 | 135 | 99.1 | 80 | 50 | ◎ | NO | 8 |
| | | Ex 11 Ta | 15 | 15 | 140 | 99.7 | 90 | 30 | ◎ | NO | 5 |
| | | | 15 | 12 | 131 | 99.6 | 120 | 40 | ◎ | NO | 9 |
| | | | 15 | 10 | 138 | 99.4 | 190 | 40 | ○ | NO | 10 |
| | | Ex 12 Hf | 15 | 22 | 202 | 99.1 | 150 | 40 | ◎ | NO | 11 |
| | | | 15 | 18 | 192 | 98.8 | 200 | 50 | ○ | NO | 13 |
| | | | 15 | 15 | 191 | 99.8 | 220 | 60 | ○ | NO | 13 |

Example 13, Example 14, Example 15

The results concerning workability, arcing, and particle count in the case of changing the average grain size, relative density, oxygen and carbon content of the respective matrixes as Example 13; a case where the conditions of Example 4 in which the W content is 15 at % and the average grain size of the minor component phase is 127 to 134 µm are used, as Example 14; a case where the conditions of Example 5 in which the Ta content is 15 at % and the average grain size of the minor component phase is 117 to 120 µm are used, and as Example 15; a case where the conditions of Example 6 in which the Hf content is 15 at % and the average grain size of the minor component phase is 158 to 162 µm are used, are shown in Table 5.

In Example 13, Example 14, and Example 15 shown in Table 5, there was no generation of arcing. In the cases of Example 13 (addition of W) and Example 14 (addition of Ta), the workability was extremely favorable in all cases, and, although the particle count increased slightly when the oxygen and carbon content increased slightly, all cases showed favorable results.

In the case of Example 15 (addition of Hf), the average grain size of the minor component phase increased somewhat, and the workability tended to deteriorate slightly when the oxygen and carbon content increased. Nevertheless, these are within a tolerable range, and were not at a problematic level.

The particle count also tended to increase slightly when the oxygen and carbon content increased, but these were not at a problematic level. Contrarily, when the oxygen and carbon content were reduced, the workability improved and the particle count tended to also decrease.

Accordingly, it could be said that the workability can be improved and the particle count can be reduced by adjusting the average grain size of the minor component phase and reducing the oxygen and carbon content. In particular, it could be said that the oxygen and carbon content should be reduced as much as possible. There was no particular influence regarding the other elements.

In the case of Example 17 (addition of Ta), the average grain size of the minor component phase increased slightly, and the workability deteriorated slightly when the oxygen and carbon content increased. Nevertheless, there was no significant variance.

In the case of Example 18 (addition of Hf), the average grain size of the minor component phase increased, and the workability deteriorated slightly when the oxygen and carbon

TABLE 5

| | Major Component | Additive | Additive Amount (at %) | Average Size of Matrix Phase (μm) | Average Size of Minor Component Metal Phase (μm) | Relative Density (%) | Oxygen Content (wtppm) | Carbon Content (wtppm) | Workability | Arcing | Particles (×10$^{-3}$ pcs/cm$^2$) |
|---|---|---|---|---|---|---|---|---|---|---|---|
| Example | Rh | Ex 13 W | 15 | 18 | 134 | 99.8 | 40 | 20 | ◉ | NO | 4 |
| | | | 15 | 16 | 130 | 99.8 | 60 | 20 | ◉ | NO | 7 |
| | | | 15 | 13 | 127 | 99.3 | 60 | 40 | ◉ | NO | 11 |
| | | Ex 14 Ta | 15 | 19 | 120 | 99.6 | 60 | 30 | ◉ | NO | 5 |
| | | | 15 | 13 | 118 | 99.4 | 130 | 20 | ◉ | NO | 4 |
| | | | 15 | 17 | 117 | 99.3 | 170 | 40 | ◉ | NO | 8 |
| | | Ex 15 Hf | 15 | 34 | 162 | 98.9 | 180 | 50 | ○ | NO | 8 |
| | | | 15 | 20 | 162 | 98.6 | 250 | 40 | ○ | NO | 9 |
| | | | 15 | 17 | 158 | 98.0 | 280 | 60 | ○ | NO | 15 |

Example 16, Example 17, Example 18

The results concerning workability, arcing, and particle count in the case of changing the average grain size, relative density, oxygen and carbon content of the respective matrixes as Example 16; a case where the conditions of Example 7 in which the W content is 15 at % and the average grain size of the minor component phase is 120 to 130 μm are used, as Example 17; a case where the conditions of Example 8 in which the Ta content is 15 at % and the average grain size of the minor component phase is 170 to 175 μm are used, and as Example 18; a case where the conditions of Example 9 in which the Hf content is 15 at % and the average grain size of the minor component phase is 180 to 190 μm are used, are shown in Table 6.

In Example 16, Example 17, and Example 18 shown in Table 6, there was no generation of arcing. In the cases of Example 16 (addition of W), the average grain size of the minor component phase increased slightly, and the workability deteriorated slightly when the carbon content increased, but otherwise showed extremely favorable results.

content increased. There was no significant variance in the particle count. Nevertheless, these were not at a problematic level. Contrarily, when the oxygen and carbon content were reduced, the workability improved and the particle count tended to also decrease.

Accordingly, it could be said that the workability can be improved by adjusting the average grain size of the minor component phase and reducing the oxygen and carbon content. In particular, it could be said that the oxygen and carbon content should be reduced as much as possible. There was no particular influence regarding the other elements.

TABLE 6

| | Major Component | Additive | Additive Amount (at %) | Average Size of Matrix Phase (μm) | Average Size of Minor Component Metal Phase (μm) | Relative Density (%) | Oxygen Content (wtppm) | Carbon Content (wtppm) | Workability | Arcing | Particles (×10$^{-3}$ pcs/cm$^2$) |
|---|---|---|---|---|---|---|---|---|---|---|---|
| Example | Ir | Ex 16 W | 15 | 21 | 120 | 99.9 | 30 | 30 | ◉ | NO | 11 |
| | | | 15 | 19 | 122 | 99.9 | 30 | 30 | ◉ | NO | 12 |
| | | | 15 | 11 | 130 | 99.6 | 30 | 40 | ○ | NO | 12 |
| | | Ex 17 Ta | 15 | 21 | 170 | 99.9 | 40 | 40 | ○ | NO | 6 |
| | | | 15 | 18 | 170 | 99.8 | 80 | 40 | ○ | NO | 5 |
| | | | 15 | 12 | 175 | 99.8 | 130 | 60 | ○ | NO | 7 |
| | | Ex 18 Hf | 15 | 30 | 180 | 98.9 | 100 | 80 | ○ | NO | 3 |
| | | | 15 | 22 | 182 | 99.0 | 170 | 100 | ○ | NO | 6 |
| | | | 15 | 22 | 190 | 98.7 | 220 | 90 | ○ | NO | 10 |

The refractory metals of ruthenium, rhodium, and iridium to become the major component in the present invention are all group 8 elements, and are approximate elements. Although the Examples illustrated a case of independently combining the respective elements with the respective minor components, it should be understood that similar results can be obtained in the high melting point alloy with the combined addition of such elements. Accordingly, the present invention additionally covers alloys with the combined addition of ruthenium, rhodium, and iridium.

In addition, although tungsten, tantalum, and hafnium respectively belong to different group elements of group 6 elements, group 5 elements and group 4 elements in the periodic table, as shown in the Examples of the present invention, when adding these elements to ruthenium, rhodium, and iridium, it has been confirmed that similar properties, operation and effect could be attained. Accordingly, it should be understood as a matter of course that the combined addition of these metals will yield similar operation and effect. Thus, it goes without saying that the combined addition of these elements is also covered by the present invention.

The alloy sintered sputtering target of refractory metals composed of major components of ruthenium, rhodium, and iridium yields a superior effect of being able to improve the target structure for preventing the dropout of metal particles other than the matrix-forming major component, improve the deposition quality by reducing impurities such as gas components, enhancing the density and eliminating the generation of arcing and particles in sputtering, as well as improve the workability of the target. Thus, the present invention is extremely useful as a deposition material of a semiconductor device, and particularly as a sputtering target for the deposition of a gate electrode material or various diffusion barriers.

The invention claimed is:

1. A sintered sputtering target of refractory metals having a composition composed of one or more types of minor components selected from W, Ta and Hf at 5 at % to less than 50 at % and at least one or more major components as the remainder selected from Ru, Rh and Ir, the target having a structure including a metal matrix phase composed of the at least one or more major component with a granular minor component metal phase scattered within the metal matrix phase, a periphery of the granular minor component metal phase including an alloy phase or a compound phase of the major and the minor components and having an average width of 5 μm to 50 μm, and said granular minor component metal phase having an average grain size of 100 μm to 500 μm and the metal matrix phase having an average grain size of 10 μm to 30 μm.

2. The sintered sputtering target composed of refractory metals according to claim 1, wherein the average grain size of the granular minor component metal phase is 100 μm to 300 μm.

3. A sintered sputtering target composed of refractory metals having a composition composed of one or more minor components selected from the group consisting of W, Ta and Hf at 5 at % to less than 50 at % and at least one or more major components as a remainder selected from Ru, Rh and Ir, the target having a structure including a metal matrix phase composed of the at least one or more major components with a granular minor component metal phase scattered within the metal matrix phase, a periphery of the granular minor component metal phase comprises an alloy phase or a compound phase of the major and the minor components and having an average width of 5 μm to 100 μm, and said granular minor component metal phase having an average grain size of 100 μm to 500 μm and the metal matrix phase having an average grain size of 10 μm to 30 μm.

4. A sintered sputtering target composed of refractory metals having a composition composed of one or more minor components selected from the group components as a remainder selected from Ru, Rh and Ir, the target having a structure including a metal matrix phase composed of the at least one or more major components with a granular minor component metal phase scattered within the metal matrix phase, a periphery of the granular minor component metal phase comprises an alloy phase or a compound phase of the major and the minor components and having an average width of 5 μm to 200 μm, and said granular minor component metal phase having an average grain size of 100 μm to 500 μm and the metal matrix phase having an average grain size of 10 μm to 30 μm.

5. The sintered sputtering target composed of refractory metals according to claim 4, wherein, as gas component impurities in the target, oxygen content is 300 wtppm or less and carbon content is 100 wtppm or less.

6. The sintered sputtering target composed of refractory metals according to claim 4, wherein total amount of impurity content, excluding gas components, within the target is 100 wtppm or less.

7. The sintered sputtering target composed of refractory metals according to claim 6, wherein relative density of the target is 98% or higher, and voids of 100 μm or greater do not exist in the target.

8. The sintered sputtering target composed of refractory metals according to claim 7, wherein variation in the composition per 1 cm$^2$ of the target area is ±10% or less.

9. The sintered sputtering target composed of refractory metals according to claim 3, wherein relative density of the target is 98% or higher, and voids of 100 μm or greater do not exist in the target.

10. The sintered sputtering target composed of refractory metals according to claim 9, wherein variation in the composition per 1 cm$^2$ of target area is ±10% or less.

11. The sintered sputtering target composed of refractory metals according to claim 3, wherein, as gas component impurities in the target, oxygen content is 300 wtppm or less and carbon content is 100 wtppm or less.

12. The sintered sputtering target composed of refractory metals according to claim 3, wherein total amount of impurity content, excluding gas components, within the target is 100 wtppm or less.

13. The sintered sputtering target composed of refractory metals according to claim 1, wherein, as gas component impurities in the target, oxygen content is 300 wtppm or less and carbon content is 100 wtppm or less.

14. The sintered sputtering target composed of refractory metals according to claim 1, total amount of impurity content, excluding gas components, within the target is 100 wtppm or less.

15. The sintered sputtering target composed of refractory metals according to claim 1, wherein relative density of the target is 98% or higher, and voids of 100 μm or greater do not exist in the target.

16. The sintered sputtering target composed of refractory metals according to claim 1, wherein variation in the composition per 1 cm$^2$ of target area is ±10% or less.

17. The sintered sputtering target composed of refractory metals according to claim 1, wherein the at least one or more major components include Rh.

18. The sintered sputtering target composed of refractory metals according to claim 1, wherein the one or more minor components include Hf.

* * * * *

UNITED STATES PATENT AND TRADEMARK OFFICE
CERTIFICATE OF CORRECTION

| | |
|---|---|
| PATENT NO. | : 8,118,984 B2 |
| APPLICATION NO. | : 12/279067 |
| DATED | : February 21, 2012 |
| INVENTOR(S) | : Ryo Suzuki |

It is certified that error appears in the above-identified patent and that said Letters Patent is hereby corrected as shown below:

Table 1, Columns 9 and 10, Additive for Comparative Example 2, "Ts" should read "Ta".

Column 14, line 8, "Sat%" should read "5at%".

Column 16, line 57, "Sat%" should read "5at%".

Table 5, Columns 23 and 24, Oxygen Content in last row of Table, "280" should read "260".

Signed and Sealed this
First Day of May, 2012

David J. Kappos
*Director of the United States Patent and Trademark Office*